United States Patent
Anderson et al.

(10) Patent No.: US 7,411,252 B2
(45) Date of Patent: Aug. 12, 2008

(54) SUBSTRATE BACKGATE FOR TRIGATE FET

(75) Inventors: Brent A. Anderson, Jericho, VT (US); Matthew J. Breitwisch, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 11/160,361

(22) Filed: Jun. 21, 2005

(65) Prior Publication Data

US 2006/0286724 A1 Dec. 21, 2006

(51) Int. Cl.
*H01L 23/62* (2006.01)

(52) U.S. Cl. ............... 257/365; 257/366; 257/E29.126; 257/E27.06; 257/E29.127; 257/213

(58) Field of Classification Search ................ 257/213, 257/316, 318, 319, E27.06, E29.126, E29.127, 257/E29.13, E29.134, E29.027, E29.028, 257/E29.067, E29.257, E29.263, E29.262, 257/365, 366

See application file for complete search history.

(56) References Cited

U.S. PATENT DOCUMENTS

| | | | |
|---|---|---|---|
| 5,646,900 | A | 7/1997 | Tsukude et al. |
| 5,917,199 | A | 6/1999 | Byun et al. |
| 6,211,533 | B1 | 4/2001 | Byun et al. |
| 6,248,626 | B1 | 6/2001 | Kumar et al. |
| 6,251,716 | B1 | 6/2001 | Yu |
| 6,433,609 | B1 | 8/2002 | Voldman |
| 6,445,032 | B1 | 9/2002 | Kumar et al. |

(Continued)

FOREIGN PATENT DOCUMENTS

WO  WO 2004/019414 A1  3/2004

(Continued)

OTHER PUBLICATIONS

Heyn, et al., "Design and Analysis of New Protection Structures for Smart Power Technology With Controlled Trigger and Holding Voltage," 6 pages.

*Primary Examiner*—Matthew C. Landau
*Assistant Examiner*—Jay Kim
(74) *Attorney, Agent, or Firm*—Gibb & Rahman, LLC

(57) ABSTRACT

Disclosed is a tri-gate field effect transistor with a back gate and the associated methods of forming the transistor. Specifically, a back gate is incorporated into a lower portion of a fin. A tri-gate structure is formed on the fin and is electrically isolated from the back gate. The back gate can be used to control the threshold voltage of the FET. In one embodiment the back gate extends to an n-well in a p-type silicon substrate. A contact to the n-well allows electrical voltage to be applied to the back gate. A diode created between the n-well and p-substrate isolates the current flowing through the n-well from other devices on the substrate so that the back gate can be independently biased. In another embodiment the back gate extends to n-type polysilicon layer on an insulator layer on a p-type silicon substrate. A contact to the n-type polysilicon layer allows electrical voltage to be applied to the back gate. A trench isolation structure extending through the polysilicon layer to the insulator layer isolates current flowing through the polysilicon layer from other devices on the silicon substrate.

16 Claims, 13 Drawing Sheets

U.S. PATENT DOCUMENTS

| | | |
|---|---|---|
| 6,534,822 B1 | 3/2003 | Xiang et al. |
| 6,580,119 B1 | 6/2003 | Hsieh |
| 6,611,023 B1 | 8/2003 | En et al. |
| 6,611,029 B1 | 8/2003 | Ahmed et al. |
| 6,664,598 B1 | 12/2003 | Dennard et al. |
| 6,674,672 B2 | 1/2004 | Forbes et al. |
| 6,756,607 B2 | 6/2004 | Yamashita et al. |
| 6,759,308 B2 | 7/2004 | Xiang et al. |
| 6,764,884 B1 | 7/2004 | Yu et al. |
| 2004/0000692 A1 | 1/2004 | Yamashita et al. |
| 2004/0036126 A1 | 2/2004 | Chau et al. |
| 2004/0036127 A1 | 2/2004 | Chau et al. |
| 2004/0094807 A1 | 5/2004 | Chau et al. |
| 2004/0145000 A1 | 7/2004 | An et al. |
| 2004/0217430 A1* | 11/2004 | Chu .......................... 257/410 |
| 2005/0035415 A1 | 2/2005 | Yeo et al. |
| 2005/0073005 A1* | 4/2005 | Nowak et al. ............... 257/347 |

FOREIGN PATENT DOCUMENTS

| | | |
|---|---|---|
| WO | WO 2004053996 A1 | 6/2004 |
| WO | WO 2004068571 A1 | 8/2004 |

* cited by examiner

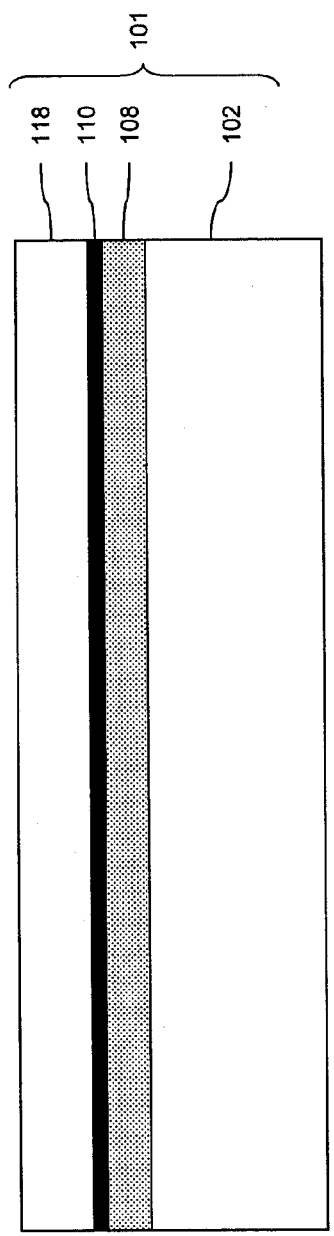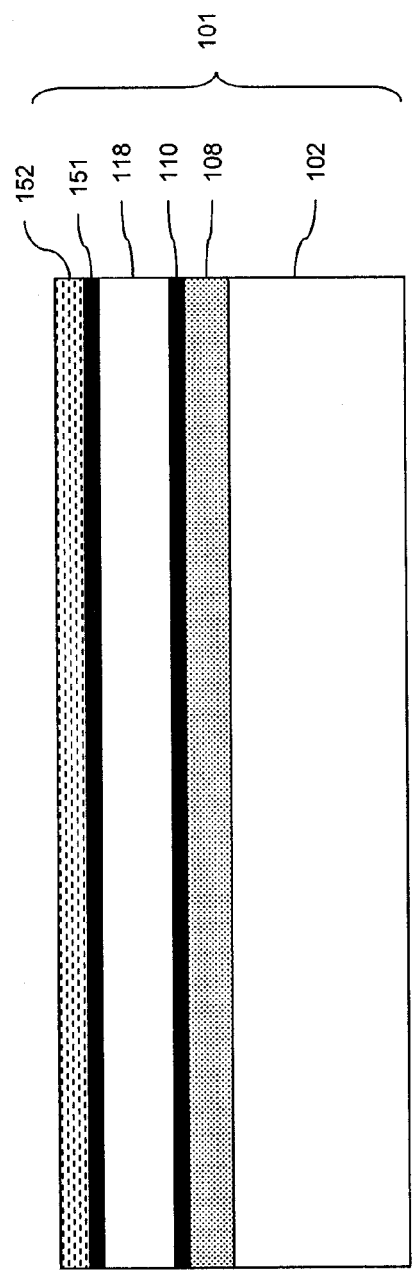

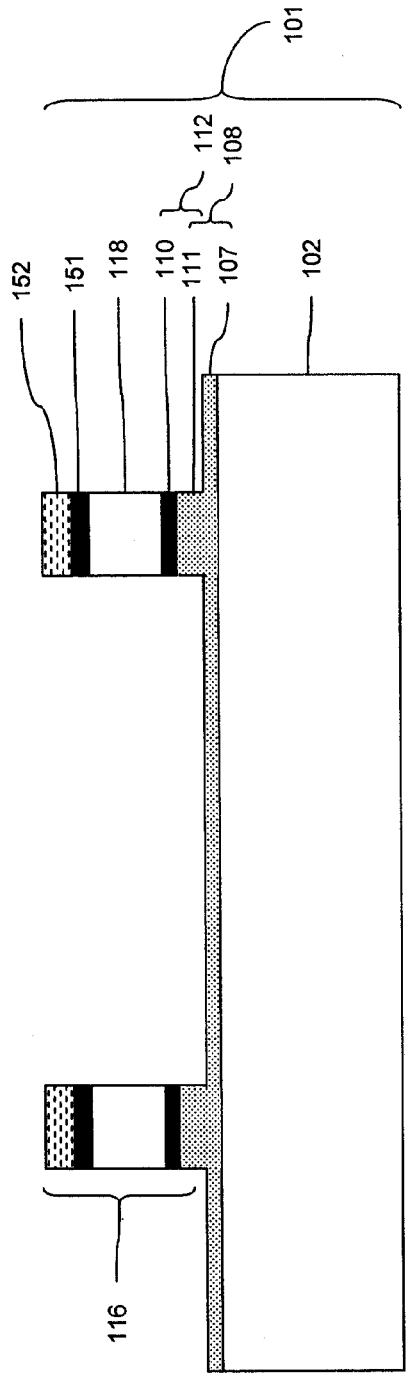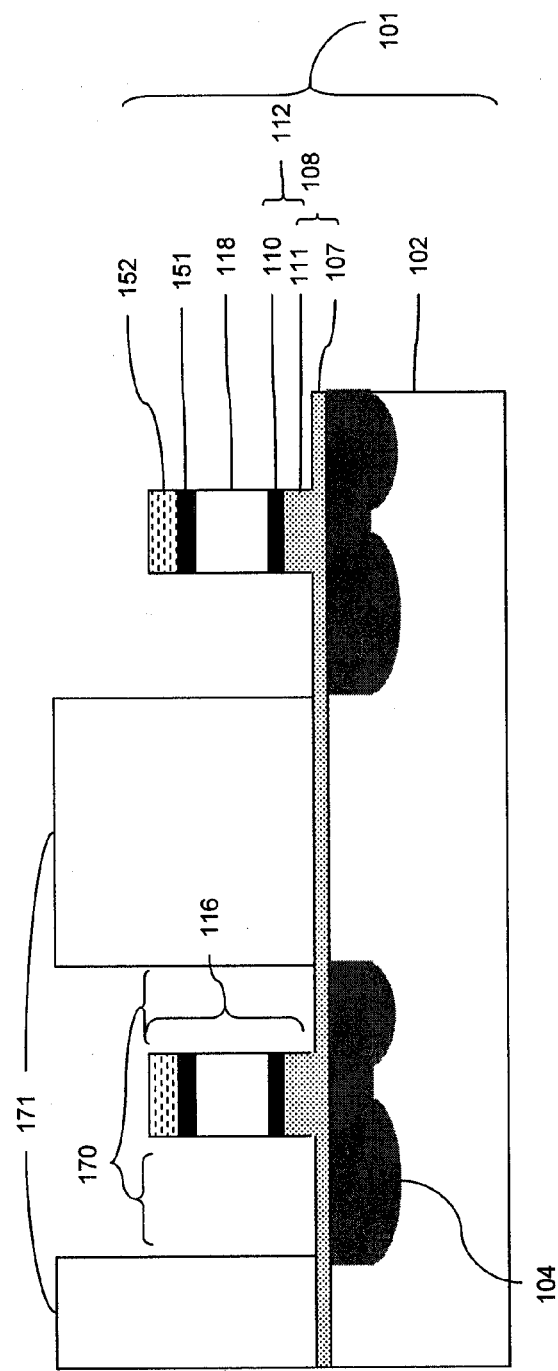

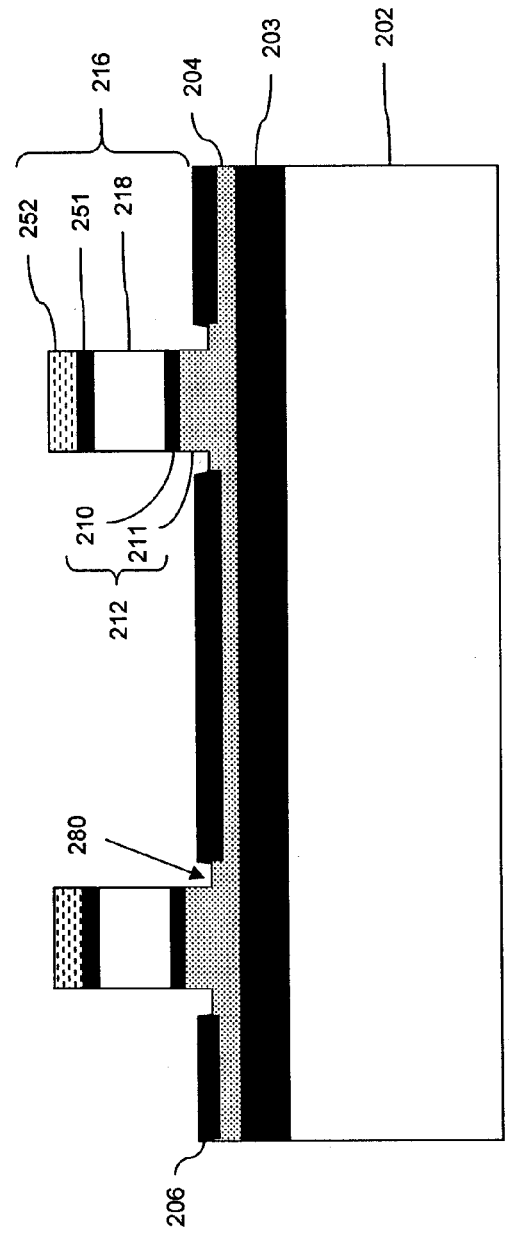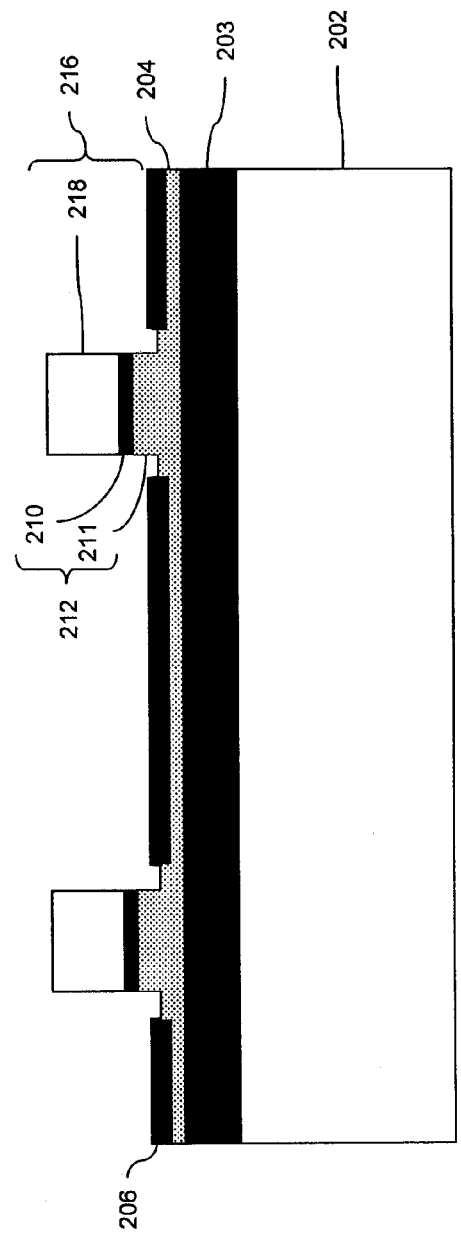
Figure 15
Figure 16

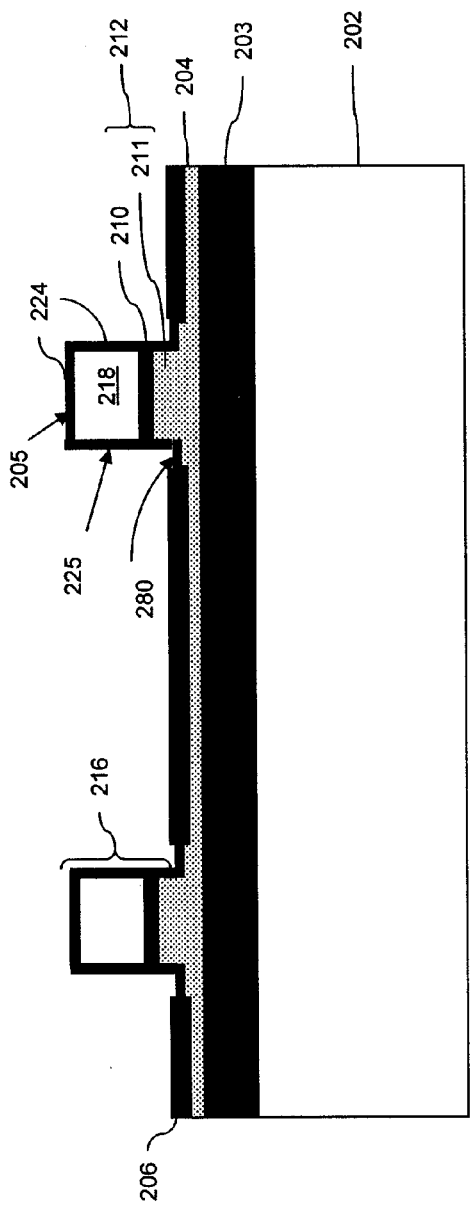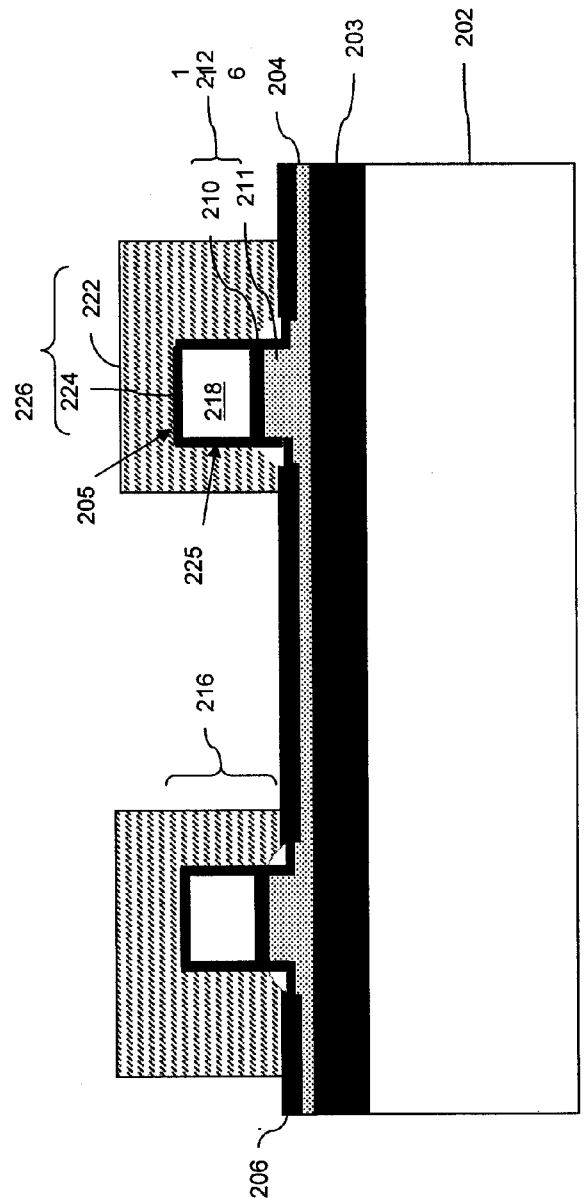

SUBSTRATE BACKGATE FOR TRIGATE FET

BACKGROUND OF THE INVENTION

1. Field of the Invention

The invention relates generally to a semiconductor device and, more particularly, to a back-gate structure to control threshold voltage for a tri-gate field effect transistor.

2. Description of the Related Art

Tri-gate field effect transistors (Tri-gate FETs) on silicon-on-insulator wafers provide the advantages of fin-type field effect transistors (FinFETs) without requiring a relatively tall thin 'fin'. As long as the height of the fin is comparable to the thickness of the fin and as long as the fin is fully depleted, the three-dimensional field effects of a tri-gate FET will give improved short-channel characteristics over a tall fin of the same thickness. Generally, the voltage threshold (Vt) of a tri-gate FET is set by work function selection and tuning or by adding donor or acceptor dopants. Consequently, the voltage threshold can not be controlled dynamically, nor can the voltage threshold be biased independently from FET to FET on the same chip. In addition, due to the statistical variation in the number of dopant atoms, unwanted voltage threshold variations can occur between FETs on the same chip. The invention described below addresses these issues by providing a back-gate structure for a tri-gate FET. The back-gate structure of the invention allows the threshold voltage for a tri-gate FET to be adjusted dynamically, for example, the threshold voltage may be increased when the transistor is not active and/or decreased when the transistor is active. Additionally, the back-gate structure of the invention allows for post fabrication adjustment of the voltage threshold for a tri-gate FET in order to improve control of chip leakage.

SUMMARY OF THE INVENTION

Disclosed herein is a tri-gate field effect transistor (FET) with a back gate and the associated methods of forming the tri-gate/back gate FET. The back gate is electrically isolated from the tri-gate (e.g., by an oxide layer) and is adapted to control the voltage threshold of the tri-gate FET. The back gate is formed by incorporating a thin back gate dielectric layer and a back gate electrode into a fin of a tri-gate FET below the channel region. In one embodiment the back gate electrode (e.g., formed with silicon germanium, silicon germanium carbide, hydrogen-doped silicon, etc.) extends to a well (e.g., an n-well) in a semiconductor substrate (e.g., a p-type silicon substrate). A contact to the well allows an electrical voltage to be applied to the back gate electrode to adjust the threshold voltage of the FET. Additionally, the n-well/p-type semiconductor substrate diode that is formed prevents current from traveling to other devices on the same silicon substrate. Thus, isolation structures between devices are not necessary and the back gate can be dynamically and independently biased. In another embodiment the back gate electrode (e.g., formed with a polysilicon material) extends to a polysilicon layer. An insulator layer below the polysilicon layer and trench isolation structures to the insulator layer isolate the polysilicon layer from other devices on the same silicon substrate (e.g., p-type silicon substrate). A contact to the polysilicon layer allows an electrical voltage to be applied to the back gate electrode to adjust the threshold voltage of the FET and the back gate can be dynamically and independently biased.

More particularly, in one embodiment of the invention a fin is located on a semiconductor substrate having a first conductivity type (e.g., a p-type silicon substrate). The fin comprises an upper semiconductor portion (e.g., p-type silicon portion) and a lower back gate portion. The lower back gate portion comprises a back gate dielectric layer (e.g., 2-50 nm thick silicon dioxide layer), and back gate electrode (e.g., silicon germanium, silicon germanium carbide, hydrogen-doped silicon, etc.). The back gate electrode is positioned in the fin below the back gate dielectric layer and contacts the semiconductor substrate. A front gate (i.e., front gate dielectric and front gate electrode) is positioned adjacent the fin. For example, a tri-gate can be positioned on a top surface and on the opposing sidewalls of the fin. The tri-gate can comprise a tri-gate dielectric layer and a tri-gate electrode. The tri-gate can be electrically isolated from both the back gate and from the semiconductor substrate (e.g., by an oxide layer on the semiconductor substrate adjacent the fin) so that the back gate may be used to adjust the threshold voltage of the FET. A well with a second conductivity type (e.g., an n-well) is located immediately below the fin within the semiconductor substrate and extends from the fin below the oxide layer. Due to the implantation process used to form the well, the well may extend deeper into the semiconductor substrate in the area below the oxide layer than it does in the area below the fin. Additionally, the well with the second conductivity type and the semiconductor substrate with first conductivity type (e.g., n-well/p-substrate) form a diode that prevents current from traveling to other devices on the same semiconductor substrate. Thus, isolation structures between different devices are not necessary and the back gate can be dynamically and independently biased. Contacts (e.g., tungsten-filled lined vias) extend to the tri-gate electrode, the well and to the source/drain regions of the fin. The contact (i.e., back gate contact) to the well allows an electrical voltage to be applied to the well. The electrical voltage is applied through the well to the back gate electrode to control threshold voltage of the FET. Additionally, the well with the second conductivity type and the semiconductor substrate with first conductivity type (e.g., n-well/p-substrate) form a diode that prevents current from traveling to other devices on the same semiconductor substrate. Thus, isolation structures between different devices are not necessary and the back gate can be dynamically and independently biased. Contacts (e.g., tungsten-filled lined vias) extend to the tri-gate electrode, the well and to the source/drain regions of the fin. The contact (i.e., back gate contact) to the well allows an electrical voltage to be applied to the well. The electrical voltage flows through the well to the back gate electrode to control threshold voltage of the FET.

In another embodiment of the invention a fin is located on a polysilicon layer with a second conductivity type (e.g., n-type polysilicon layer). The polysilicon layer is positioned on an insulator layer, which is positioned on a semiconductor substrate (e.g., a p-type silicon substrate). The fin comprises an upper semiconductor portion with a first conductivity type (e.g., p-type silicon portion) and a lower back gate portion. The lower back gate portion comprises an approximately a back gate dielectric layer (e.g., an approximately 2-50 nm thick silicon dioxide layer) and a back gate electrode with a second conductivity type (e.g., an n-type polysilicon portion). The back gate electrode is positioned below the back gate dielectric layer in the fin and extends to the polysilicon layer. A front gate (i.e., a front gate dielectric and a front gate electrode) can be positioned adjacent the fin. For example, a tri-gate can be positioned on a top surface and on the opposing sidewalls of the fin. A tri-gate can comprise a tri-gate dielectric layer on the top surface and opposing sidewalls of the fin and a tri-gate electrode can be positioned on the tri-gate dielectric layer in a region of the fin corresponding to the channel region. The front gate is electrically isolated from the back gate and the polysilicon layer so that the back gate can be used to adjust the threshold voltage of the FET. For example, a tri-gate can be isolated from the back gate by an oxide layer and by the tri-gate dielectric layer. Contacts (e.g., tungsten-filled lined vias) extend to the tri-gate electrode, to the polysilicon layer and to the source/drain regions of the fin. The contact (i.e., back gate contact) to the polysilicon layer allows an electrical voltage to be applied to the polysilicon layer. The electrical voltage flows through the polysilicon layer to the back gate electrode to control threshold voltage of the FET. Additionally, trench isolation structures can extend through the oxide layer and the polysilicon layer to the insulator layer in order to isolate the FET from other devices on the semiconductor substrate. Isolating the polysilicon layer from other devices on the substrate allows the back gate to be dynamically and independently biased.

One embodiment of the method of forming a tri-gate field effect transistor having a back gate starts with forming a wafer that comprises semiconductor substrate with a first conductivity type (e.g., a p-type silicon substrate), a second semiconductor layer (e.g., an n-type silicon germanium, silicon germanium carbide, hydrogen-doped silicon, etc. or other silicon material that oxidizes rapidly), an insulator layer (e.g., an approximately 2-50 nm thick silicon dioxide layer) and a third semiconductor layer with the first conductivity type (e.g., a p-type silicon layer). The wafer is lithographically patterned and etched through the third semiconductor layer, through the insulator layer, and partially into the second semiconductor layer to form a fin. The fin thus comprises an upper semiconductor portion (e.g., a remaining portion of the third semiconductor layer) and a lower back gate portion. The lower back gate portion of the fin comprises a back gate dielectric layer that is the remaining portion of the insulator layer and a back gate electrode that is an etched portion of the second semiconductor layer. After the fin is formed, a well having a second conductivity type (e.g., an n-well) is formed in the semiconductor substrate (e.g., p-type silicon substrate) below the fin. Specifically, the well is formed by first masking portions of the wafer such that only the fin and an area adjacent the fin in the semiconductor substrate are exposed. Then, a second conductivity type dopant (e.g., n-type dopant such as phosphorous, arsenic, or antimony) is implanted beneath the fin and the area adjacent the fin. Due to the ion implantation process used, the well may be implanted deeper into the area adjacent the fin than it is below the fin. Once the well is formed, the back gate is electrically isolated from a front gate formed on the fin during later processing steps by forming an oxide layer on the substrate above the well and on either side of the fin. This oxidation process used to form the oxide layer will simultaneously oxidize the sidewalls of the fin corresponding to the back gate electrode. After forming the oxide layer, a front gate can be formed adjacent the fin. For example, a tri-gate structure can be formed on the top surface and on the opposing sidewalls of the fin above the oxide layer. A front gate (e.g., a tri-gate) can be formed by forming (e.g., by growing or depositing) a tri-gate dielectric layer on the top and sidewalls of the fin and then by forming (e.g., by depositing, patterning and etching) a tri-gate electrode on the tri-gate dielectric layer above the oxide layer in an area of the fin corresponding to the channel region. Once the tri-gate and back gate structures are completed, additional processing may include forming source/drain extensions, forming halos, forming spacers, forming source/drain regions, and depositing and planarizing an additional dielectric layer. Furthermore, vias can be etched through the dielectric layer to the well, to the tri-gate electrode and to the source/drain regions of the fin. Once formed, the vias may be lined and filled with a conductor such as tungsten to form contacts. In particular, the back gate contact to the well allows electrical voltage to be applied to the back gate through the well so that the threshold voltage of the tri-gate field effect transistor can be adjusted and the back gate can be dynamically biased. Due to the diode formed between the well (n-well) and the semiconductor substrate (p-type silicon substrate), the back gate is electrically isolated from other devices on the semiconductor substrate and thus the back gate can be independently biased.

Another embodiment of a method of forming a tri-gate field effect transistor having a back gate starts with forming wafer that comprises a semiconductor substrate with a first conductivity type (e.g., a p-type silicon substrate), a first insulator layer, a polysilicon layer with a second conductivity type (e.g., an n-type polysilicon layer), a second insulator layer (e.g., an approximately 2-50 nm thick silicon dioxide layer) and a second semiconductor layer with the first conductivity type (e.g., a second p-type silicon layer). The first insulator layer should be formed such that it is relatively thick as compared to the second insulator layer. The wafer is etched through the second semiconductor layer, through the second insulator layer, and partially into the polysilicon layer. Thus, the fin comprises an upper semiconductor portion and a lower back gate portion. The lower back gate portion of the fin comprises a back gate dielectric layer that is a remaining portion of the second insulator layer and a back gate electrode that is an etched portion of the polysilicon layer. Additionally, another portion of the polysilicon layer remains on the first insulator layer. A front gate (e.g., a tri-gate) is also formed adjacent to the fin.

The back gate is electrically isolated from the tri-gate and from other devices on the substrate so that it may be dynamically and independently biased. The back gate can be isolated from a tri-gate by a combination of both an oxide layer and a dielectric layer of the tri-gate. For example, before forming the tri-gate adjacent the fin, an oxide layer can be formed on the portion of the polysilicon layer remaining on the first insulator layer. The oxide layer is formed by forming spacers on the fin sidewalls. Then, a top surface of the portion of the polysilicon layer remaining on the first insulator layer is oxidized and the spacers are removed. Removing the spacers exposes a section of the portion of the polysilicon layer remaining on the first insulator layer (i.e., an exposed section of polysilicon) in the space between the oxide layer and the fin. After the oxide layer is formed, the tri-gate dielectric layer is formed on the fin. The tri-gate dielectric layer can be formed by growing or depositing a dielectric layer on a top surface of the fin, on opposing sidewalls of the fin and on the exposed section of polysilicon. The tri-gate electrode is formed on the tri-gate dielectric layer and above the oxide layer in an area of the fin corresponding to the channel region. Once the tri-gate and back gate structures are completed, the back gate may be isolated from other devices on the semiconductor substrate by forming a trench isolation structure through the oxide layer and the polysilicon layer to the first insulator layer. Additional processing steps may comprise forming source/drain extensions, forming halos, forming spacers, forming source/drain regions, and depositing and planarizing an additional dielectric layer. Furthermore, vias can be etched through the other dielectric layer to the tri-gate electrode, to the polysilicon layer and to the source/drain regions of the fin. Once formed, the vias may be lined and filled with tungsten to form contacts. In particular, the back gate contact to the polysilicon layer allows an electrical voltage to be applied to the back gate through the polysilicon layer so that the threshold voltage of the FET can be adjusted. Since the back gate is electrically isolated it may be independently biased. These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 4 is a schematic diagram illustrating a partially completed structure of FIG. 1;

FIG. 5 is a schematic diagram illustrating a partially completed structure of FIG. 1;

FIG. 6 is a schematic diagram illustrating a partially completed structure of FIG. 1;

FIG. 7 is a schematic diagram illustrating a partially completed structure of FIG. 1;

FIG. 15 a schematic diagram illustrating a partially completed structure of FIG. 2;

FIG. 16 a schematic diagram illustrating a partially completed structure of FIG. 2;

FIG. 17 a schematic diagram illustrating a partially completed structure of FIG. 2;

FIG. 18 a schematic diagram illustrating a partially completed structure of FIG. 2;

DETAILED DESCRIPTION OF PREFERRED EMBODIMENTS OF THE INVENTION

Figure 1:
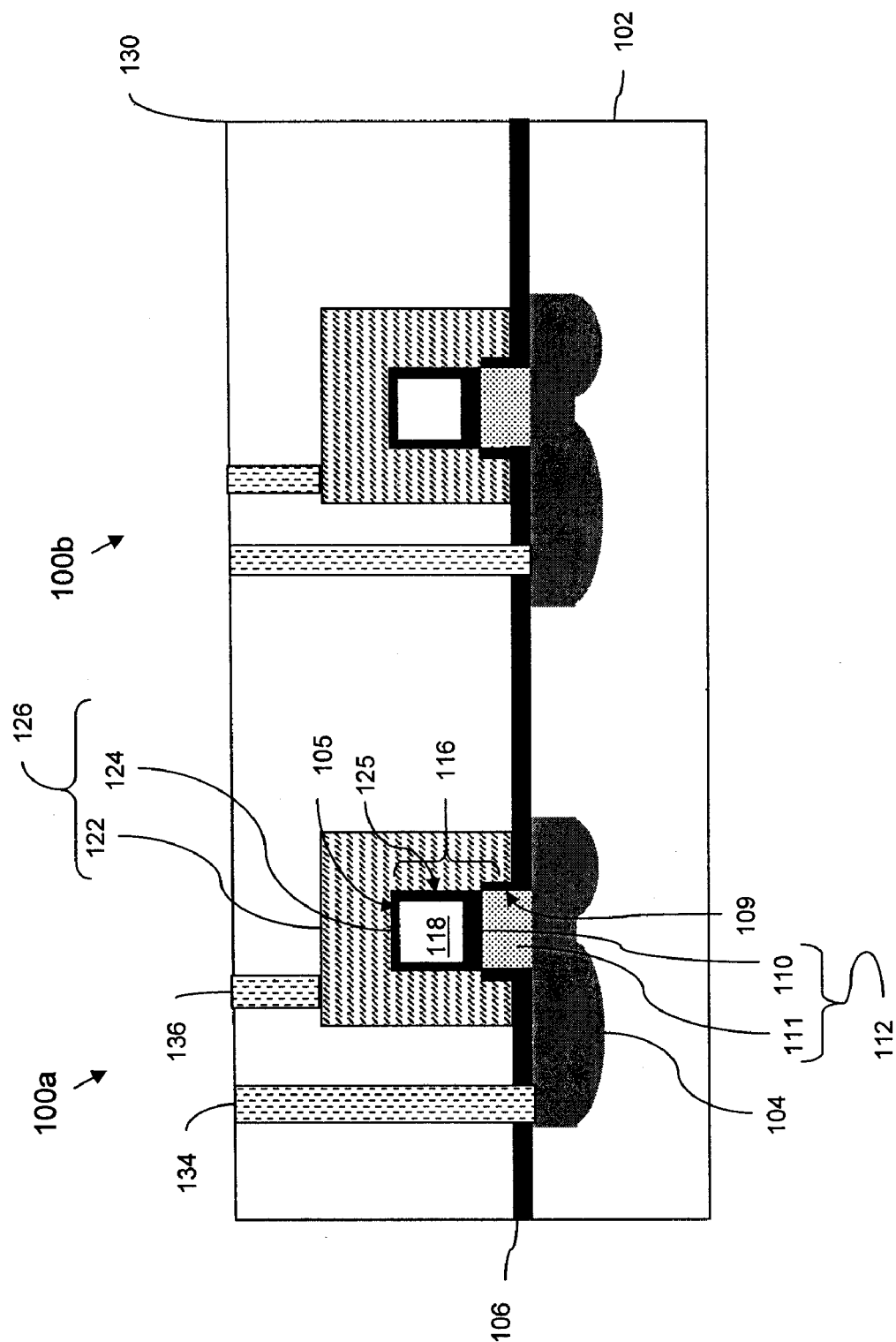
FIG. 1 is a schematic diagram illustrating one embodiment of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 2:
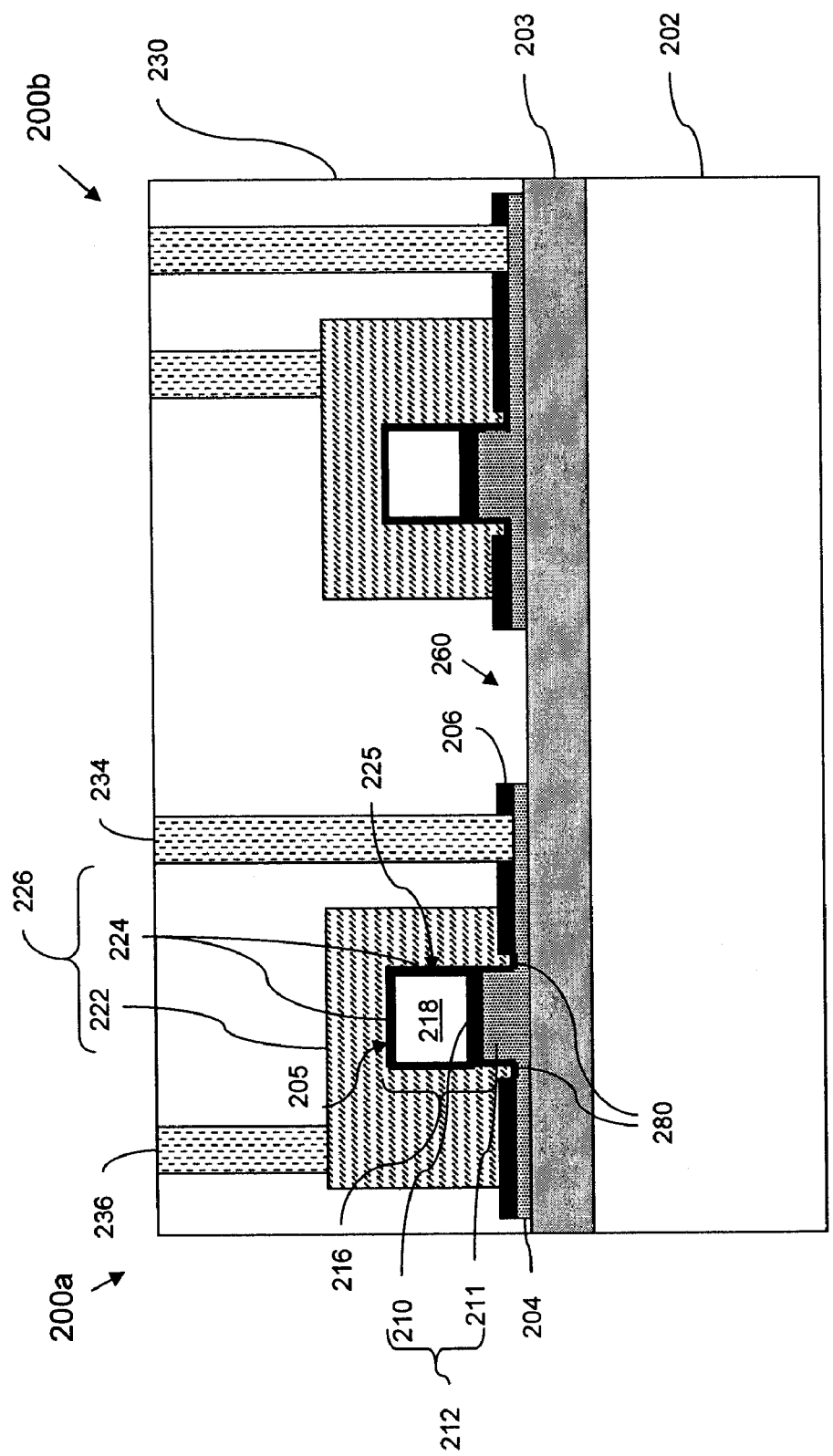
FIG. 2 is a schematic diagram illustrating another embodiment of the invention.
Figure 3:
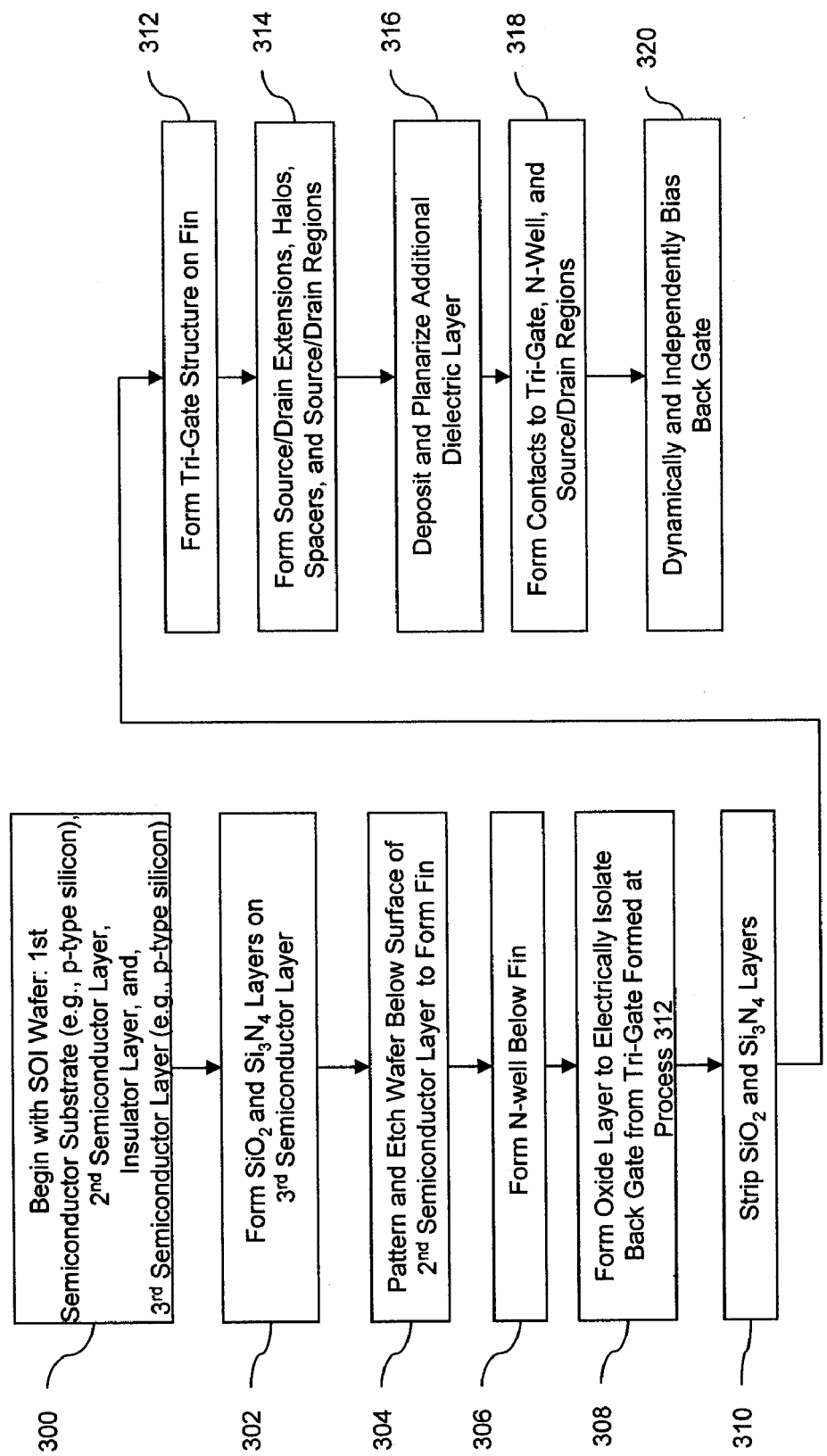
FIG. 3 is a schematic flow diagram illustrating a method of forming the structure of FIG. 1.
Figure 10:
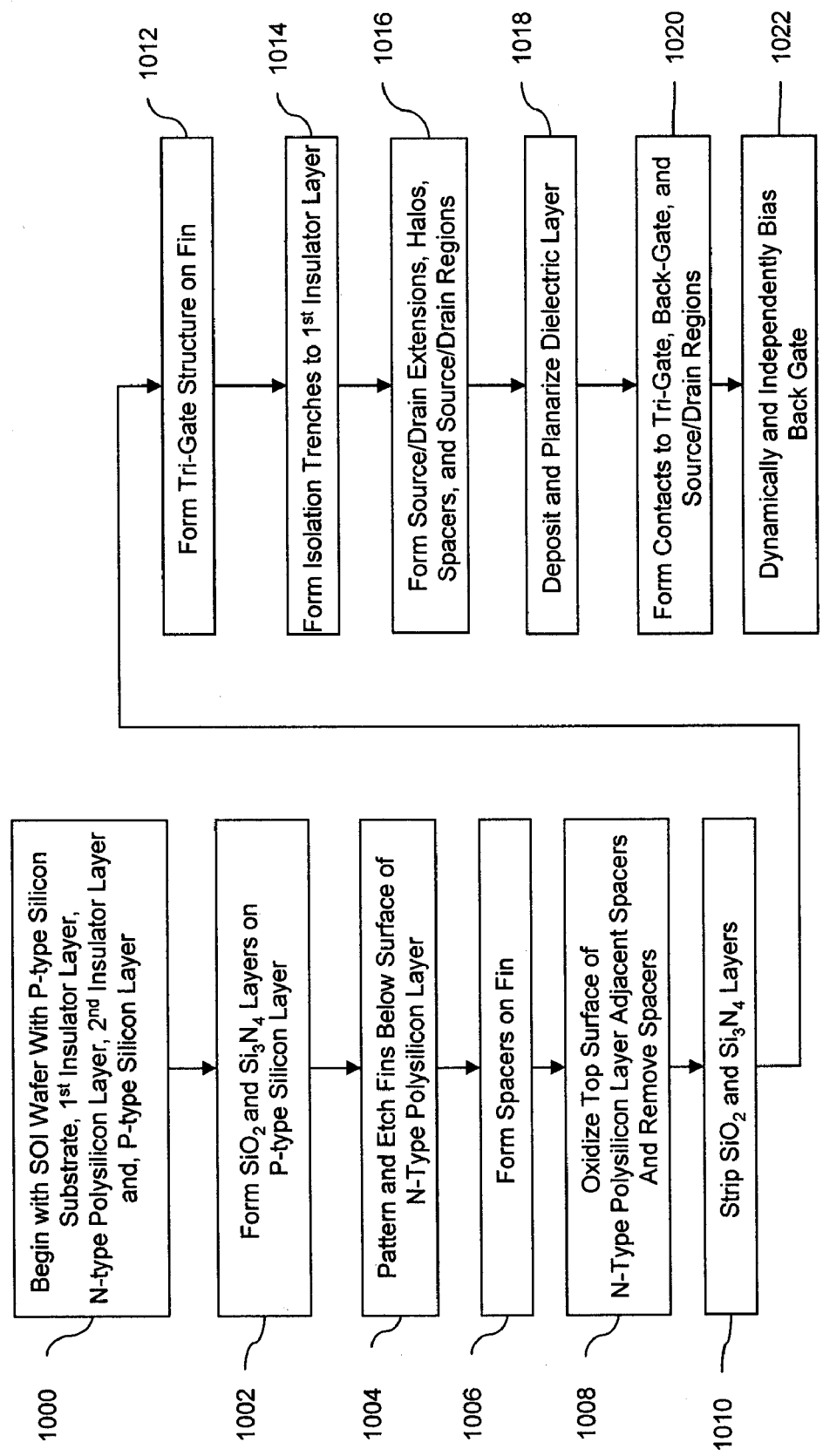
FIG. 10 is a schematic flow diagram illustrating a method of forming the structure of FIG. 2.

Referring to FIGS. 1 and 2, disclosed herein are two exemplary embodiments of a tri-gate field effect transistor (FET) 100a and b, 200a and b with a back gate structure 112, 212 and the associated methods of forming the FETs (see the flow diagrams of FIGS. 3 and 10). The back gate 112, 212 is electrically isolated from a front gate (e.g., a tri-gate 126, 226) by an oxide layer 106, 206 and is adapted to reduce or eliminate threshold voltage variation due to dopant atom fluctuation. Additionally, if the back gate 112, 212 is isolated from other devices (e.g., 100b, 200b) on the substrate, the back gate 112, 212 may be independently and dynamically biased to vary the voltage threshold of the tri-gate FET 100a, 200a, as needed. For example, if the back gate 112 of 100a, 212 of 200a are isolated from 100b and 200b, respectively, then back gates 112 and 212 can be independently biased. The back gate 112, 212 is formed by incorporating a relatively thin back gate dielectric layer 110, 210 and a back gate electrode 111, 211 into a lower back gate portion 112, 212 of a fin 116, 216 of a tri-gate FET 100, 200 below the an upper semiconductor portion 118, 218. In the embodiment illustrated in FIG. 1, the back gate electrode 111 (e.g., silicon germanium, silicon germanium carbide, hydrogen-doped silicon, or other silicon material that oxidizes rapidly) extends to well 104. The back gate electrode 111 and the well 104 each have the same conductivity type (i.e., a second conductivity type). For example, the back gate electrode 111 and the well 104 may each be doped with an n-type dopant. The well 104 is in a semiconductor substrate 102 having a first conductivity type that is different from the second conductivity type (e.g., a p-type silicon substrate). A back gate contact 134 allows an electrical voltage to be applied to the back gate electrode 111 through the well 104 in order to adjust the threshold voltage of the FET 100. Additionally, the n-well 104/p-substrate 102 diode that is formed prevents current from traveling to other devices (e.g., 100b) on the same substrate 102. Thus, isolation structures between devices 100a and 100b are not necessary and the back gate structure 112 can be dynamically and independently biased. In the embodiment illustrated in FIG. 2, the back gate electrode 211 (e.g., an n-type polysilicon) extends to a polysilicon layer 204 having a second conductivity type (e.g., n-type polysilicon layer). A back gate contact 234 allows an electrical voltage to be applied to the back gate electrode 211 through the polysilicon layer 204 in order to adjust the threshold voltage of the FET 200. The polysilicon layer 204 is isolated from semiconductor substrate 202 with a first conductivity type (e.g., p-type silicon substrate) by a thick insulator layer 203 and from other devices (e.g., 200b) on the semiconductor substrate 202 by trench isolation structures 260 between the devices (e.g., between 200a and 200b). Thus, the back gate structure 212 can be dynamically and independently biased.

More particularly, referring to FIG. 1, in one embodiment of the invention a fin 116 is located on a semiconductor substrate 102 with a first conductivity type (e.g., p-type silicon substrate). The fin 116 comprises an upper semiconductor portion 118 with the first conductivity type (e.g., a p-type silicon portion) 118 and a lower back gate portion 112. The lower back gate portion 112 comprises a back gate dielectric layer 110 (e.g., an approximately 2-50 nm silicon dioxide layer) below the upper semiconductor portion 118 and a back gate electrode 111 below the back gate dielectric layer. The back gate electrode 111 can comprise a silicon germanium, silicon germanium carbide, hydrogen-doped silicon, or other suitable silicon material that oxidizes rapidly and is positioned on the semiconductor substrate 102. An oxide layer 106 is positioned on the semiconductor substrate 102 and further extends up the lower portions 109 of the opposing sidewalls 125 of the fin 116 in an area corresponding to the back gate electrode 111. Additionally, within the semiconductor substrate 102 immediately below the fin 116 and extending from the fin 116 outward below the oxide layer 106 is a well 104 having a second conductivity type (e.g., an n-well). Due to the implantation process used to form the well 104, the well 104 may extend deeper into the semiconductor substrate 102 in the area below the oxide layer 106 than it does in the area below the fin 116. A front gate 126 (i.e., a front gate dielectric layer and a front gate electrode) can be positioned adjacent to the fin 116. The front gate 126 can comprise a tri-gate comprising a tri-gate dielectric layer 124 and a tri-gate electrode 122 on the top surface 105 and opposing sidewalls 125 of the fin 116. In particular, the tri-gate electrode 122 is positioned on the top surface 105 and opposing sidewalls 125 of the fin in an area corresponding to the channel region 173 of the fin 116 (see FIG. 18). The tri-gate electrode 122 can extends down to the oxide layer 106. The oxide layer 106 isolates the tri-gate 126 from the back gate 112 and the well 104. Referring to the top view illustration of FIG. 18, contacts (e.g., tungsten-filled lined vias) extend to the tri-gate electrode 122 (e.g., see contact 136), the well 104 (e.g., see contact 134) and to the source/drain regions 174 (e.g., see contact 138) of the fin 116. The back gate contact 134 to the well 104 allows an electrical voltage to be applied to the back gate electrode 111 through the well 104 to adjust the threshold voltage of the FET. Additionally, the well 104 with the second conductivity type (e.g., n-well) and the semiconductor substrate 102 with the first conductivity type (e.g., p-type silicon substrate) form a diode that prevents current from traveling to other devices (e.g., 100b) on the same substrate 102. Thus, isolation structures between devices 100a, 100b are not necessary and the back gate 112 can be dynamically and independently biased.

Referring to FIG. 2, in another embodiment of the invention a fin 216 is located on a polysilicon layer 204 with a second conductivity type (e.g., an n-type polysilicon layer). The polysilicon layer 204 is positioned on a relatively thick insulator layer 203 (e.g., silicon dioxide) which is positioned on a semiconductor substrate 202 with a first conductivity type (e.g., a p-type silicon substrate). The fin 216 comprises an upper semiconductor portion 218 with a first conductivity type (e.g., a p-type silicon portion) and a lower back gate portion 212. The lower back gate portion 212 comprises a back gate dielectric layer 210 (e.g., an approximately 2-50 nm silicon dioxide layer) below the upper semiconductor portion 218 and a back gate electrode 211 having a second conductivity type (e.g., an n-type polysilicon) below the back gate dielectric layer 210. The back gate electrode 211 contacts and is positioned above the polysilicon layer 204. An oxide layer 206 (e.g., an oxidized top surface of the polysilicon layer 204) can be positioned above the polysilicon layer 204 with a space 280 separating the oxide layer 206 from the fin 216. A front gate 226 (i.e., a front gate dielectric layer and a front gate electrode) can be positioned adjacent the fin 216 and above the oxide layer 206. For example, a tri-gate 226 may be located on a top surface 205 and on opposing sidewalls 225 of the fin 216. The tri-gate 226 can comprise a tri-gate dielectric layer 224 (i.e., a front gate dielectric layer) that is located (e.g., grown or deposited) on the top surface 205 of the fin 216, on opposing sidewalls 225 of the fin 216, as well as in the space 280 between the fin 216 and the oxide layer 206. The oxide layer 206 and the portion of the tri-gate dielectric layer 224 between the fin 216 and the oxide layer 206 isolate the tri-gate 226 from the back gate 212 so that the back gate 212 may be used to adjust the threshold voltage of the FET. The tri-gate 226 can also comprise a tri-gate electrode 222 (i.e., front gate electrode) that is positioned on the tri-gate dielectric layer 224 on the top surface 205 and on the opposing sidewalls 225 of the fin 216 in a region of the upper semiconductor portion 218 corresponding to the channel region 273 of the FET 200 (see FIG. 18). Referring to FIG. 18, contacts (e.g., tungsten-filled lined vias) can extend to the tri-gate electrode 222 (e.g., see contact 236), the polysilicon layer 204 (e.g., see contact 234) and to the source/drain regions 274 of the fin 216 (e.g., see contacts 238). The back gate contact 234 to the polysilicon layer 204 allows an electrical voltage to be applied to the back gate electrode 211 through the polysilicon layer 204 in order to adjust the threshold voltage of the FET 200. Additionally, referring back to FIG. 2, trench isolation structures 260 that extend through the oxide layer 206 and through the polysilicon layer 204 to the insulator layer 203 electrically isolate the polysilicon layer 204 and the back gate 212 from other devices (e.g., 200b) on the semiconductor substrate 202. Thus, the back gate 212 can be independently biased.

Referring to FIG. 3, an embodiment of the method of forming a tri-gate field effect transistor 100 having a back gate 112, as illustrated in FIG. 1, begins with a layered wafer 101 that comprises a semiconductor substrate 102 with a first conductivity type (e.g., a p-type silicon substrate), a second semiconductor layer 108 (e.g., an approximately 100-300 nm thick silicon germanium, silicon germanium carbide, a hydrogen-doped silicon, or any similar silicon material that promotes rapid oxidation), an insulator layer 110 (e.g., an approximately 2-50 nm thick silicon dioxide layer), and a third semiconductor layer 118 with the first conductivity type (e.g., another p-type silicon layer) (300, see FIG. 4). A 3 nm oxide layer 151 (e.g., silicon dioxide) can be grown or deposited on the third semiconductor layer 118, followed by the deposition of a 7 nm nitride layer 152 (e.g., silicon nitride) (302; see FIG. 5).

The wafer is etched through the nitride layer 152, through the oxide layer 151, through the third semiconductor layer 118, through the insulator layer 110, and partially into the second semiconductor layer 108 to form a fin 116 (304, see FIG. 6). Forming the fin 116 can be accomplished by depositing a photo resist layer on the nitride layer 152. The fin 116 is then lithographically patterned and the wafer is etched. Referring to FIG. 6, once etched at process 304, the fin 116 comprises an upper semiconductor portion 118 that is the remaining portion of the third semiconductor layer and a lower back gate portion 112. The lower back gate portion 112 comprises a back gate dielectric layer 110 that is a remaining portion of the insulator layer and a back gate electrode 111 that is an etched portion of the second semiconductor layer 108. Another portion 107 of the second semiconductor layer 108 remains on the semiconductor substrate 102. Portions of the oxide layer 151 and nitride layer 152 remain on top of the upper semiconductor portion 118 of the fin 116.

After the fin 116 is formed, a well 104 with a second conductivity type is formed in the semiconductor substrate 102 below the fin 116 (306, see FIG. 7). Specifically, the well 104 is formed by first masking 171 portions of the wafer 101 such that only the fin 116 and areas 170 immediately adjacent the fin 116 in the semiconductor substrate 102 are exposed. Then, a second type dopant (e.g., n-type dopant such as phosphorous, arsenic, or antimony) is implanted beneath the fin 116 and into the areas 170 of the semiconductor substrate 102 adjacent the fin 116. Due to the ion implantation process used, the well 104 may be implanted deeper into the areas 170 adjacent the fin 116 than it is below the fin 116. The well 104 contacts the back-gate electrode 111 for a back gate 212 of the tri-gate field effect transistor 100.

Figure 8:
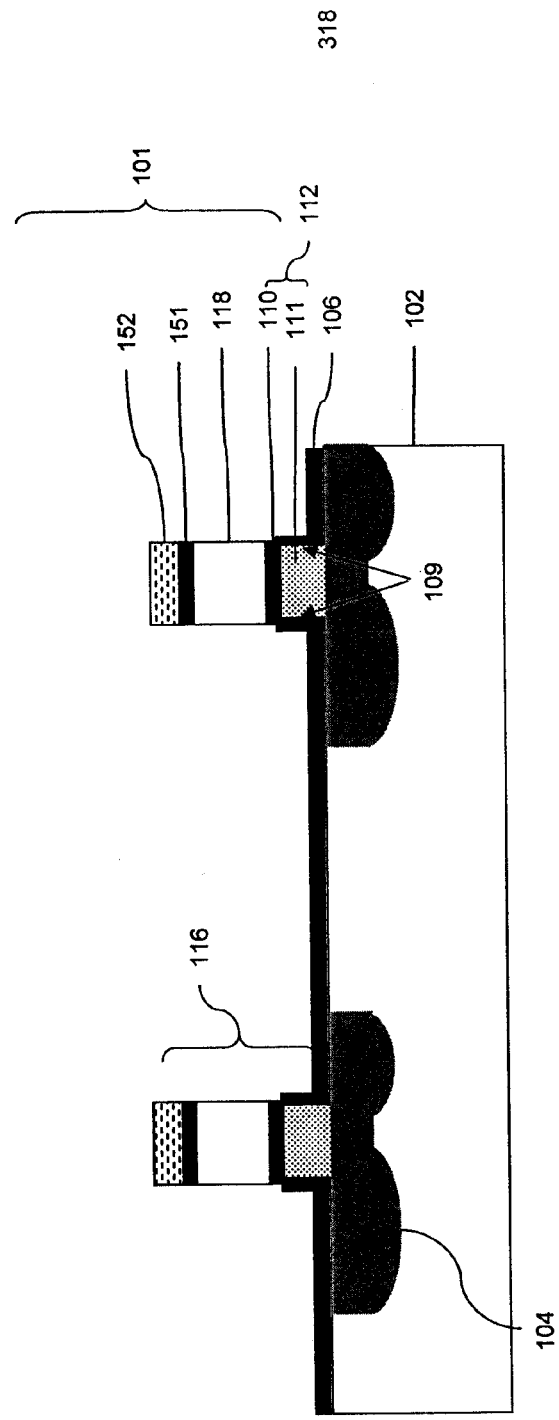
FIG. 8 is a schematic diagram illustrating a partially completed structure of FIG. 1.

Once the well 104 is formed at process 306 and the mask 171 is removed, the well and back gate 112 are electrically isolated at process 308 from a front gate (e.g., a tri-gate), discussed below. Isolating the well 104 and the back gate 112 can be accomplished, for example, by forming an oxide layer 106 above the well 104 and on the opposing sidewalls 109 of the fin 116 in an area corresponding to the gate electrode 111 (308, FIG. 8). One method of forming the oxide layer 106 is by oxidizing the remaining the portion 107 of the second semiconductor layer 108 remaining on the semiconductor substrate 102 and simultaneously oxidizing a top surface of the a lower portion 109 of the opposing sidewalls 125 of the fin 116 in an area corresponding to the back gate electrode 111. Once the oxide layer 106 is formed, the nitride layer 152 on the fin 116 can be selectively removed with either hot phosphoric acid or a selective reactive ion etching. The oxide layer 151 on the fin 116 can also be selectively removed with reactive ion etching (310). Removing the fin oxide layer 151 will thin the oxide layer 106 by only 3 nm.

Figure 9:
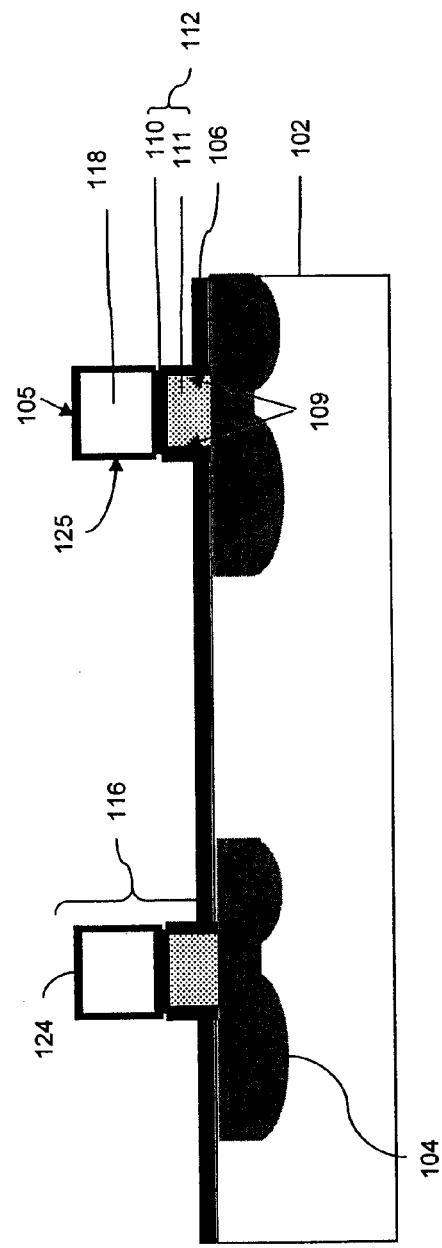
FIG. 9 is a schematic diagram illustrating a partially completed structure of FIG. 1.

After forming the oxide layer 106, a front gate such as a tri-gate 126 can be formed adjacent the fin 116 above oxide layer 106 (312). The oxide layer 106 electrically isolates the back gate 112 from the tri-gate 126 so that the back gate 112 can be used to adjust the threshold voltage of the FET. The tri-gate 126 can be formed by growing or depositing a thin dielectric layer 124 on the opposing sidewalls 125 in an area corresponding to the upper semiconductor portion 118 of the fin 116 and on a top surface 105 of the fin 116 (312, see FIG. 9). Then, a conductor is deposited over the fin 116, patterned and etched to form the tri-gate electrode 122 on an area of the fin 116 corresponding to the channel region 173 (see FIGS. 1 and 18). Once the tri-gate 126 and back gate 112 structures are completed, additional processing may include forming source/drain extensions, forming halos, forming spacers, forming source/drain regions, and depositing and planarizing an additional dielectric layer 130 (314-316). Furthermore, vias can be etched through the additional dielectric layer 130 to the tri-gate electrode 126, to the well 104, and to the source/drain regions 174 of the fin. These vias are lined and filled with a conductor such as tungsten to form contacts (318; see contact 136 of FIGS. 1 and 18; see contact 134 of FIGS. 1 and 18; and, see contacts 138 of FIG. 18). In particular, the back gate contact 134 allows an electrical voltage to be applied to the back gate 112 through the well 104, so that the threshold voltage of the tri-gate field effect transistor 100 can be adjusted and the back gate can be dynamically biased. A diode formed between the well 104 (e.g., n-well) and the semiconductor substrate 102 (e.g., p-type silicon substrate) isolates a current that is applied to the well 104 from other devices (e.g., 100b) on the semiconductor substrate 102 so that the back gate 112 may be independently biased (320).

Figure 11:
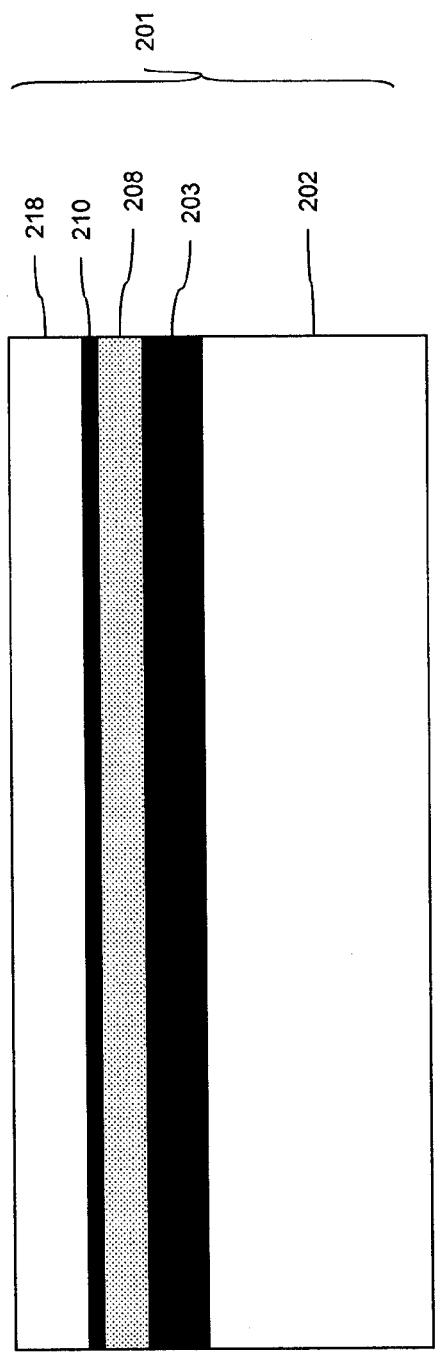
FIG. 11 a schematic diagram illustrating a partially completed structure of FIG. 2.
Figure 12:
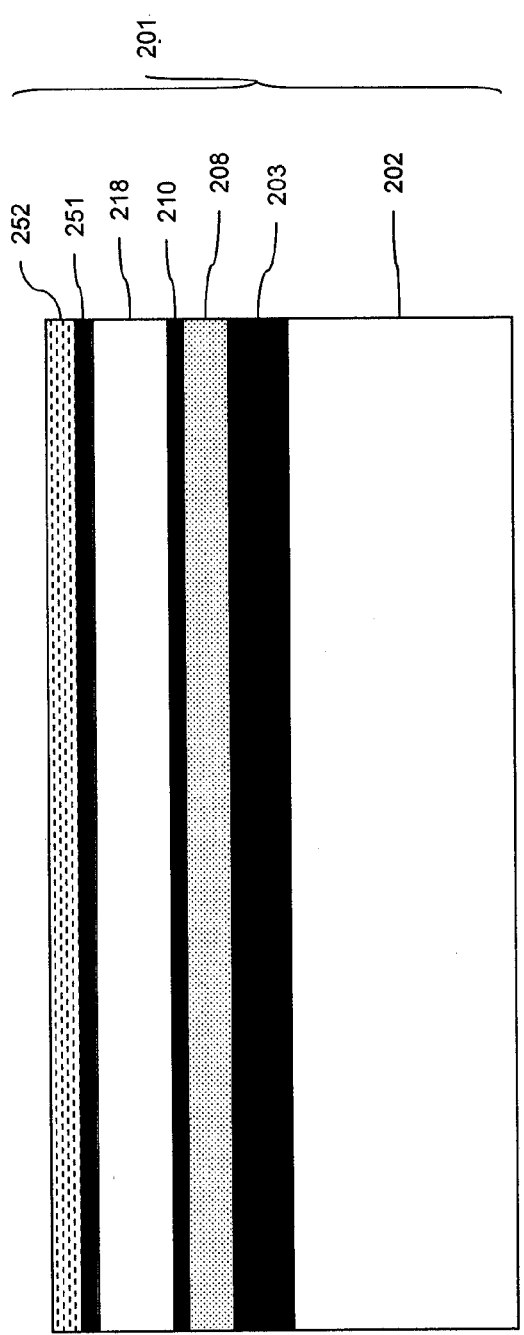
FIG. 12 a schematic diagram illustrating a partially completed structure of FIG. 2.

Referring to FIG. 10, an embodiment of a method of forming a tri-gate field effect transistor 200 having a back gate 212, as illustrated in FIG. 2, starts with a layered wafer 201 that comprises a semiconductor substrate 202 with a first conductivity type (e.g., a p-type silicon substrate), a first insulator layer 203 (e.g., a first silicon dioxide layer), a polysilicon layer 208 with a second conductivity type (e.g., an n-type polysilicon layer), a second insulator layer 210 and a second semiconductor layer 218 with the first conductivity type (e.g., a second p-type silicon layer) (1000; see FIG. 11). The first insulator layer 203 should be formed such that it is relatively thick as compared to the second insulator layer 210. The second insulator layer 210 should be between 2 and 50 nm thick. A 3 nm oxide layer 251 (e.g., silicon dioxide) can be grown or deposited on the second semiconductor layer 218, followed by the deposition of a 7 nm nitride layer 252 (e.g., silicon nitride) (1002; see FIG. 12).

Figure 13:
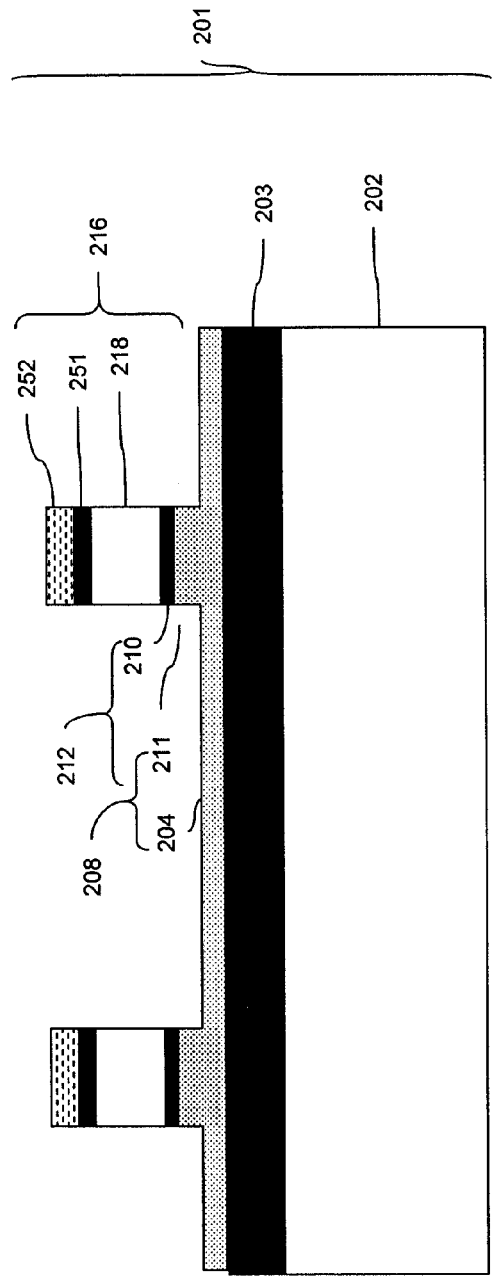
FIG. 13 a schematic diagram illustrating a partially completed structure of FIG. 2.

The wafer 201 is etched through the nitride layer 252, through the oxide layer 251, through the second semiconductor layer 218, through the second insulator layer 210 and partially into the polysilicon layer 208 to form a fin 216. Etching the fin 216 can be accomplished by depositing a photo resist layer on the nitride layer 252. The fin 216 is then lithographically patterned and etched (1004; see FIG. 13) such that the fin 216 comprises an upper semiconductor layer 218 that is a remaining portion of the second semiconductor layer and a lower back gate portion 212. The lower back gate portion 212 comprises a back gate dielectric layer 210 that is a remaining portion of the second insulator layer and a back gate electrode 211 that is an etched portion of the polysilicon layer 208. Another portion 204 of the second semiconductor layer 208 remains on the semiconductor substrate 102. Portions of the oxide layer 251 and nitride layer 252 remain on top of the upper semiconductor portion 218 of the fin 216.

Figure 14:
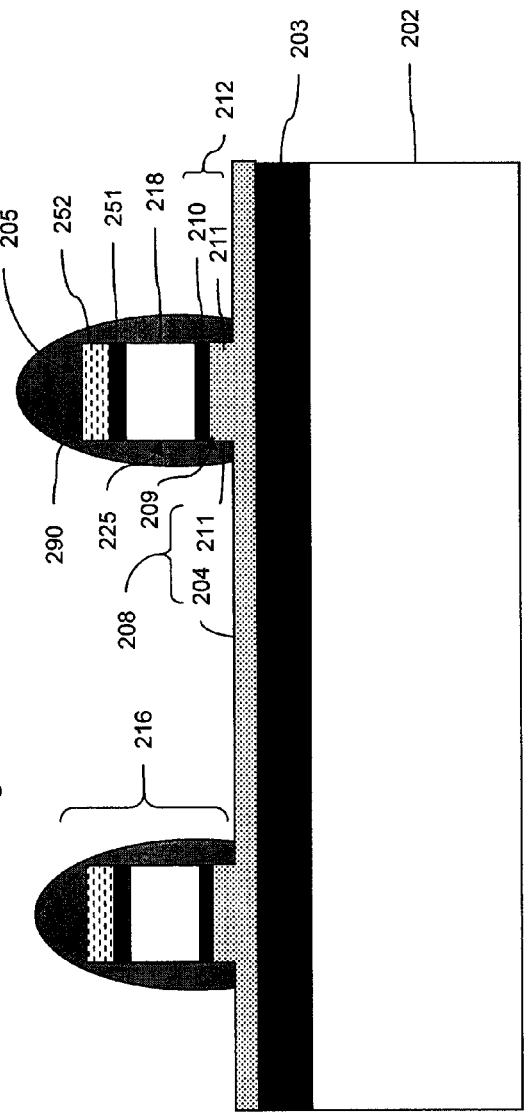
FIG. 14 a schematic diagram illustrating a partially completed structure of FIG. 2.

An oxide layer 206 is then formed on the portion 204 of the polysilicon layer remaining on the first insulator layer 203 (1008). The oxide layer 206 is formed by first forming spacers 290 on the fin 216 (e.g., over the top 205, upper sidewalls 225 and lower sidewalls 209 of the fin 216) (1006, see FIG. 14). A top surface of the portion 204 of polysilicon layer remaining on the first insulator layer 203 is oxidized and the spacers 290 are removed leaving an exposed polysilicon surface 280 of portion 204 of the polysilicon layer between the fin 216 and the oxide layer 206 (1008, see FIG. 15). After the oxide layer 206 is formed and the spacers 290 are removed at process 1008, the nitride layer 252 on the fin 216 can be selectively removed with either hot phosphoric acid or a selective reactive ion etching. The oxide layer 251 on the fin 216 can also be selectively removed with reactive ion etching (1010, see FIG. 16). Removing the fin oxide layer 251 will thin the oxide layer 206 by only 3 nm.

Figure 19:
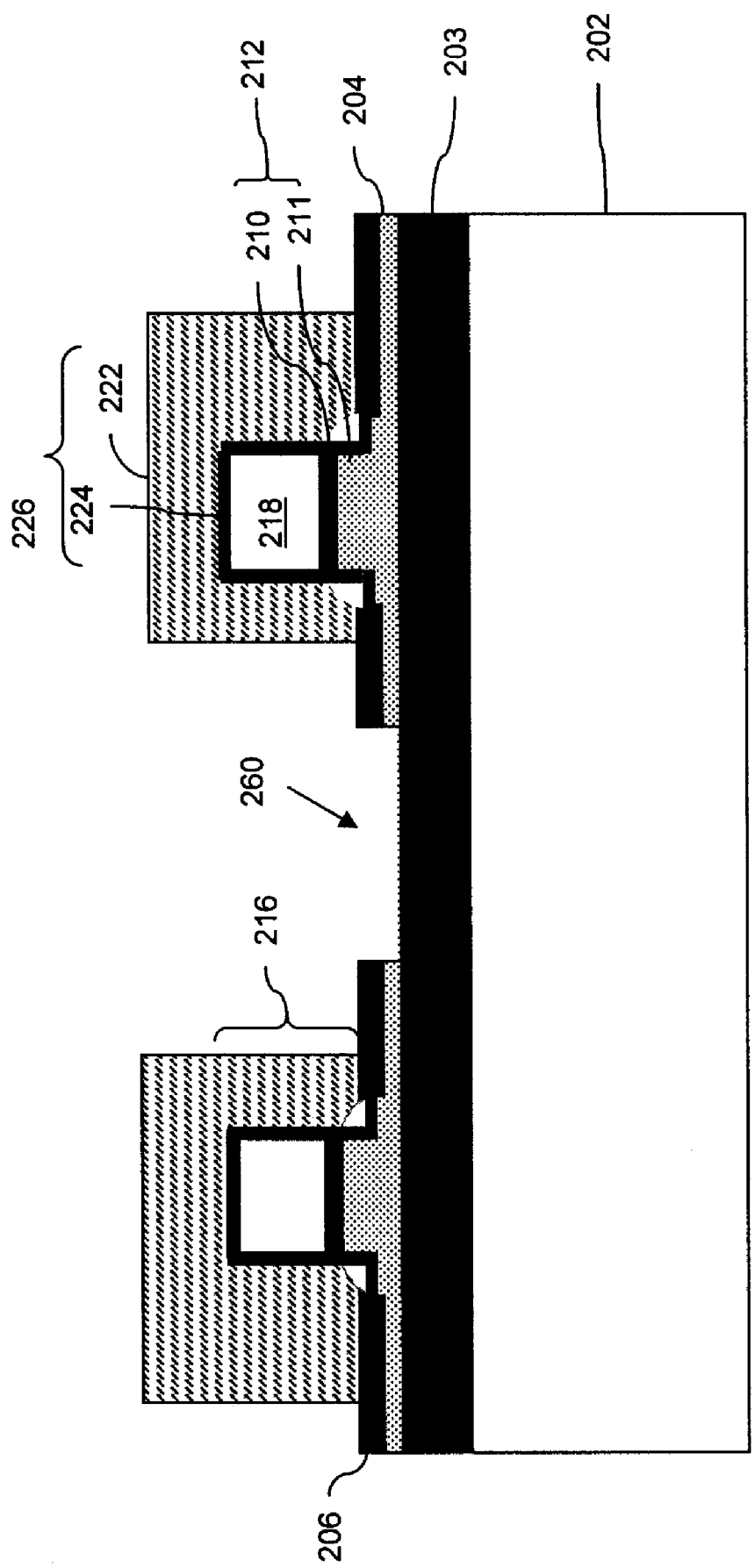
FIG. 19 a schematic diagram illustrating a partially completed structure of FIG. 2; and, FIG. 20 a schematic diagram illustrating a top view of the invention.
Figure 20:
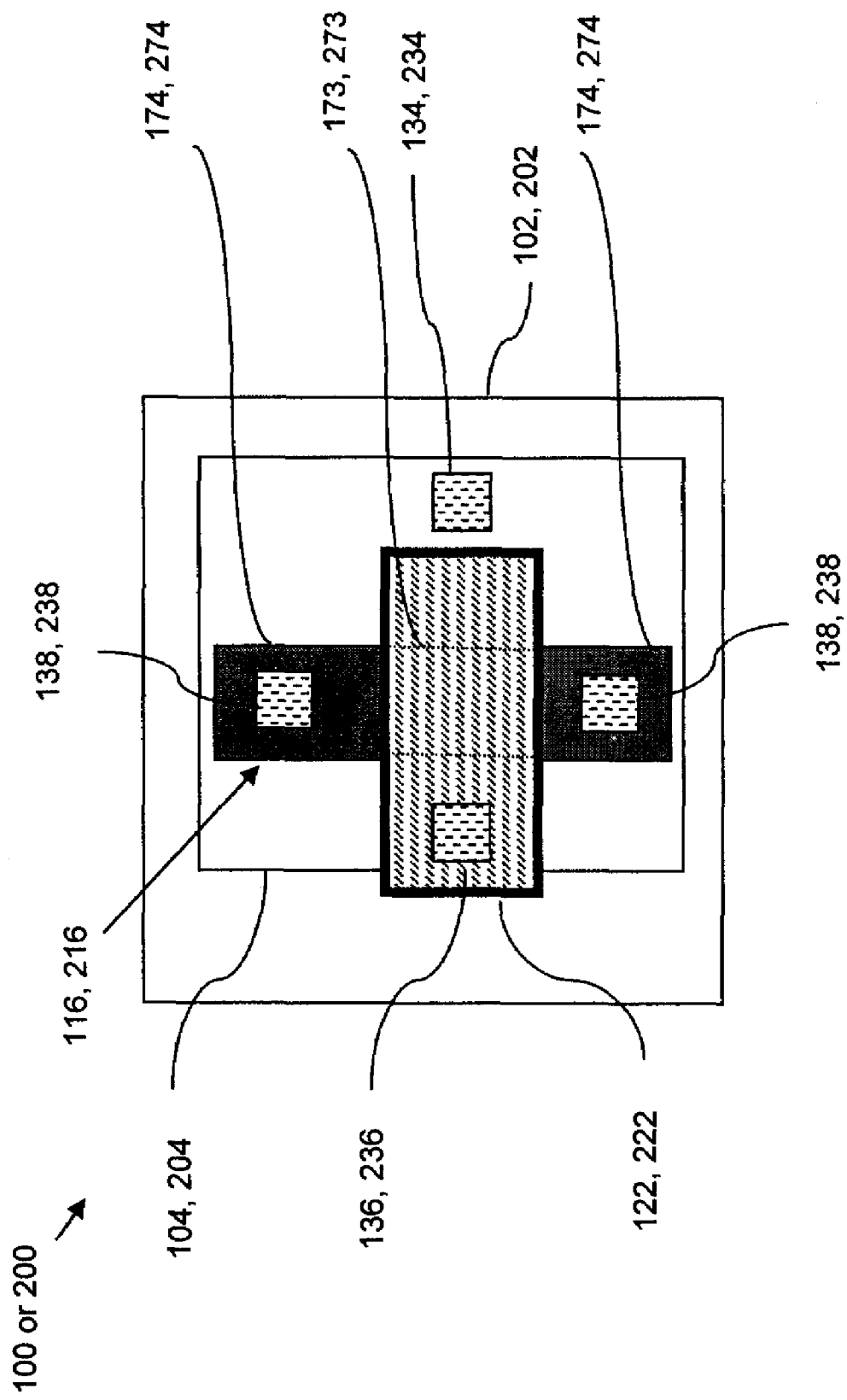

A front gate such as a tri-gate 226 can then be positioned adjacent the fin 216 (1012). Specifically, a thin tri-gate dielectric layer 224 can be grown or deposited on the top surface 205 of the fin 216, on opposing sidewalls 225 of the fin 216, and in the space 280 between the fin and the oxide layer 206 (see FIG. 17). The oxide layer 206 and the tri-gate dielectric layer 224 electrically isolate the tri-gate 226 from the back gate 212. A conductor is deposited over the fin 216 and onto the oxide layer 206, patterned and etched to form the tri-gate electrode 222 on an area of the fin 216 corresponding to the channel region 273 (see FIGS. 18). Electrically isolating the back gate 212 from the tri-gate 226 allows the back gate to be used to adjust the threshold voltage of the FET. Once the tri-gate 226 and back gate 212 structures are completed, a trench isolation structure 260 may be formed through the oxide layer 206 and the polysilicon layer 204 to the first insulator layer 203 in order to isolate the back gate electrode 211 from other devices (e.g., 200b) on the semiconductor substrate 202 (1014, see FIG. 19). Then, additional processing steps may be performed to complete the FET, such steps may include forming source/drain extensions, forming halos, forming spacers, forming source/drain regions, and depositing and planarizing an additional dielectric layer 230 (1016-1018). Furthermore, vias can be etched through the additional dielectric layer 230 to the tri-gate electrode 226, to the polysilicon layer 204, and to the source/drain regions 274 of the fin. These vias are lined and filled with a conductor such as tungsten to form contacts (1020, see contact 236 of FIGS. 2 and 18; see contact 234 of FIGS. 2 and 18; and, see contacts 238 of FIG. 20). In particular, the back gate contact 234 allows electrical voltage to be applied to the back gate 212 through the polysilicon layer 204, so that the threshold voltage of the tri-gate field effect transistor 200 can be adjusted and the back gate 212 can be dynamically biased (1022).

Therefore, disclosed above is a tri-gate field effect transistor (FET) with a back gate for controlling threshold voltage and the associated methods of forming the tri-gate FET. In each embodiment a back gate is electrically isolated from the tri-gate (e.g., by an oxide layer). The back gate is formed by incorporating lower back gate portion comprising a thin back gate dielectric layer and a back gate electrode into a fin of a tri-gate FET below an upper semiconductor portion. In one embodiment the back gate electrode within the fin extends to an n-well region in a p-type silicon substrate. A back gate contact to the n-well allows an electrical voltage to be applied to the back gate electrode through the n-well. Additionally, a diode formed between the n-well and p-substrate prevents current from traveling to other devices on the same substrate so that the back gate can be independently biased. In another embodiment the back gate electrode within the fin extends to an n-type polysilicon layer. A back gate contact to the polysilicon layer allows an electrical voltage to be applied to the back gate electrode through the polysilicon layer. The n-type polysilicon layer is isolated from a p-type silicon substrate by a thick insulator layer and from other devices on the substrate by trench isolation structures. Thus, the back gate structure of the tri-gate FET can be dynamically and independently biased. While the invention has been described in terms of embodiments, those skilled in the art will recognize that the invention can be practiced with modification within the spirit and scope of the appended claims.

What is claimed is:

1. A field effect transistor comprising:
    a substrate;
    a fin on said substrate,
        wherein said fin comprises:
            an upper semiconductor portion; and,
            a lower back gate portion, and
        wherein said lower back gate portion comprises:
            a back gate dielectric layer below said upper semiconductor portion; and
            a back gate electrode between said substrate and said back gate dielectric layer;
    a front gate adjacent a top surface and opposing sidewalls of said upper semiconductor portion of said fin and electrically isolated from said back gate electrode;
    an additional dielectric layer on said substrate and extending vertically along opposing sidewalls of said back gate electrode so as to electrically isolate said front gate from said back gate electrode,
    wherein said front gate comprises:
        a front gate dielectric layer on said top surface and on said opposing sidewalls of said upper semiconductor portion of said fin; and,
        a front gate electrode on said additional dielectric layer and said front gate dielectric layer.

2. The field effect transistor of claim 1, further comprising a contact electrically connected to said back gate electrode and adapted to allow an electrical voltage to be applied to said back gate electrode so as to dynamically and independently bias said lower back gate portion.

3. The field effect transistor of claim 1, wherein said lower back gate portion controls threshold voltage of said field effect transistor.

4. The field effect transistor of claim 1, wherein said back gate electrode has a designated conductivity type.

5. A field effect transistor comprising:
    a semiconductor substrate, having a first conductivity type;
    a fin on said semiconductor substrate,
        wherein said fin comprises:
            an upper semiconductor portion, having said first conductivity type; and,
            a lower back gate portion, and w
        herein said lower back gate portion comprises:
            a back gate dielectric layer below said upper semiconductor portion; and
            a back gate electrode between said semiconductor substrate and said back gate dielectric layer;
    a front gate adjacent a top surface and opposing sidewalls of said upper semiconductor portion of said fin and electrically isolated from said back gate electrode and from said semiconductor substrate; and,
    a well, having a second conductivity type different from said first conductivity type, in said semiconductor substrate below said lower back gate portion of said fin, wherein said back gate electrode is in contact with said well.

6. The field effect transistor of claim 5, further comprising an additional dielectric layer on said semiconductor substrate and extending vertically along opposing sidewalls of said back gate electrode so as to electrically isolate said front gate from said back gate electrode and said semiconductor substrate,
    wherein said front gate comprises:
        a front gate dielectric layer on said top surface and on said opposing sidewalls of said upper semiconductor portion of said fin; and,
        a front gate electrode on said additional dielectric layer and said front gate dielectric layer.

7. The field effect transistor of claim 5, further comprising a contact electrically connected to said well, wherein an electrical voltage applied to said contact is applied through said well to said back gate electrode and dynamically and independently biases said lower back gate portion.

8. The field effect transistor of claim 5, wherein said lower back gate portion controls threshold voltage of said field effect transistor.

9. The field effect transistor of claim 8, wherein said back gate electrode comprises one of silicon germanium, silicon germanium carbide and hydrogen-doped silicon.

10. The field effect transistor of claim 8, wherein said back gate electrode has said second conductivity type.

11. A field effect transistor comprising:
    a substrate;
    a fin on said substrate,
        wherein said fin comprises:
            an upper semiconductor portion; and,
            a lower back gate portion, and
        wherein said lower back gate portion comprises:
            a back gate dielectric layer below said upper semiconductor portion; and
            a back gate electrode between said substrate and said back gate dielectric layer; and,
    a front gate adjacent a top surface and opposing sidewalls of said upper semiconductor portion of said fin and electrically isolated from said back gate electrode, wherein said back gate electrode comprises one of silicon germanium and silicon germanium carbide, and
    wherein said back gate electrode has a designated conductivity type.

12. A field effect transistor comprising:
a semiconductor substrate, having a first conductivity type;
a fin on said semiconductor substrate,
    wherein said fin comprises:
        an upper semiconductor portion, having said first conductivity type; and,
        a lower back gate portion, and
    wherein said lower back gate portion comprises:
        a back gate dielectric layer below said upper semiconductor portion; and
        a back gate electrode between said semiconductor substrate and said back gate dielectric layer, wherein said back gate electrode has a second conductivity type different from said first conductivity type;
an additional dielectric layer on said semiconductor substrate and on opposing sidewalls of said back gate electrode;
a front gate above said additional dielectric layer and further adjacent said upper semiconductor portion of said fin such that said additional dielectric layer electrically isolates said front gate from said back gate electrode and from said semiconductor substrate; and,
a well, having said second conductivity type, in said semiconductor substrate below said lower back gate portion of said fin, wherein said back gate electrode is in contact with said well.

13. The field effect transistor of claim 12, wherein said front gate comprises:
    a front gate dielectric layer on a top surface and on opposing sidewalls of said upper semiconductor portion of said fin; and,
    a front gate electrode on said additional dielectric layer and on said front gate dielectric layer.

14. The field effect transistor of claim 12, further comprising a contact electrically connected to said well, wherein an electrical voltage applied to said contact is applied through said well to said back gate electrode and dynamically and independently biases said lower back gate portion.

15. The field effect transistor of claim 12, wherein said lower back gate portion controls threshold voltage of said field effect transistor.

16. The field effect transistor of claim 12, wherein said back gate electrode comprises one of silicon germanium, silicon germanium carbide and hydrogen-doped silicon.

* * * * *